United States Patent
Takizawa

(10) Patent No.: US 6,518,608 B1
(45) Date of Patent: Feb. 11, 2003

(54) SEMICONDUCTOR INTEGRATED CIRCUIT DEVICE WITH ENHANCED PROTECTION FROM ELECTROSTATIC BREAKDOWN

(75) Inventor: Noboru Takizawa, Yokohama (JP)

(73) Assignee: Rohm Co., Ltd., Kyoto (JP)

( * ) Notice: Subject to any disclaimer, the term of this patent is extended or adjusted under 35 U.S.C. 154(b) by 93 days.

(21) Appl. No.: 09/693,818

(22) Filed: Oct. 23, 2000

(30) Foreign Application Priority Data

Oct. 25, 1999 (JP) .......................................... 11-301847

(51) Int. Cl.[7] .............................................. H01L 29/80
(52) U.S. Cl. .......................... 257/256; 257/259; 257/263
(58) Field of Search ................................ 257/256, 259, 257/203, 263, 265, 211, 208, 207, 528, 533, 532, 262, 264; 438/186, 192

(56) References Cited

U.S. PATENT DOCUMENTS

| | | | | |
|---|---|---|---|---|
| 4,780,846 A | * | 10/1988 | Tanabe et al. | 365/63 |
| 5,401,989 A | * | 3/1995 | Kikuchi | 257/211 |
| 5,828,108 A | * | 10/1998 | Toyoda | 257/372 |
| 5,952,684 A | * | 9/1999 | Tashiro | 257/207 |
| 6,339,234 B1 | * | 1/2002 | Takizawa | 257/203 |

FOREIGN PATENT DOCUMENTS

| | | | |
|---|---|---|---|
| JP | 07-022617 | 1/1995 | .......... H01L/29/78 |
| JP | 09-172146 | 6/1997 | .......... H01L/27/04 |

OTHER PUBLICATIONS

Motto et al., A new intelligent power module with microprocessor compatible analog current feedback, control input, and status output signals, Thirty–First IAS Annual Meeting, IAS '96., Conference Record of the 1996, pp. 1287–1291.*

* cited by examiner

*Primary Examiner*—Olik Chaudhuri
*Assistant Examiner*—(Vikki) Hoa B. Trinh
(74) *Attorney, Agent, or Firm*—Morgan, Lewis & Bockius LLP

(57) ABSTRACT

A semiconductor integrated circuit device includes a plurality of internal circuits formed in a circuit forming region; a plurality of power lines separately connected to the internal circuits; a signal wire routed between the internal circuits; and a protection circuit connected to the power lines, the protection circuit including a parallel circuit having a first rectifying element formed in a p-type semiconductor region and a second rectifying element formed in an n-type semiconductor region.

15 Claims, 4 Drawing Sheets

SEMICONDUCTOR INTEGRATED CIRCUIT DEVICE WITH ENHANCED PROTECTION FROM ELECTROSTATIC BREAKDOWN

This application claims the benefit of application no. 11-301847, filed in Japan on Oct. 25, 1999, which is hereby incorporated by reference.

BACKGROUND OF THE INVENTION

1. Field of the Invention

The present invention relates generally to a semiconductor integrated circuit device which contains a plurality of internal circuits driven by separate power supplies, such as multi-function large scaled integrated (LSI) circuit devices, digital and analog hybrid LSI devices, multi-powered digital LSI devices, and more particularly, to a device for protecting the internal circuits from electrostatic discharge which extends over the circuits.

2. Discussion of the Related Art

Semiconductor integrated circuit devices which contain a plurality of internal circuits driven by separate power supplies tend to have an intra-block protection circuit but omit an inter-block protection circuit in order to prevent interference from occurring between the separate power supplies and to prevent noise from propagating from one circuit to another through a power supply system not associated therewith. When the inter-block protection circuit is omitted, this results in complete isolation of the internal circuits as well as complete isolation of power lines connected thereto. Therefore, if surge noise due to electrostatic discharge or the like is introduced on one of the power lines, for example, a power line of a 5-volt system, an undesired potential difference is generated between inter-circuit signal wiring and a power line of the other power supply system, for example, a power line of a 3-volt system, possibly damaging internal elements such as an input element provided in an internal circuit to which the inter-circuit signal wiring is connected.

As countermeasures for preventing the electrostatic breakdown, an inter-block protection circuit has been provided as well between one block comprising an internal circuit and input/output circuits associated therewith, and another block is configured in a similar manner, i.e., between both blocks, when their respective intra-block protection circuits are not sufficient to protect associated internal circuits. Such an inter-block protection circuit includes diodes, transistors and so on, and is connected to both power lines through which different supply voltages are provided (in many cases, a pair or a set of power lines).

As internal elements have become increasingly vulnerable to breakdown as a result of the miniaturization of internal circuits, protection against electrostatic breakdown has been enhanced by increasing the size of intra-block protection circuits, the number of which is smaller than that of internal elements, and increasing the number or size of inter-block protection circuits. However, since the miniaturization and faster operation of internal circuits are still advancing without limits, sufficient protection can no longer be ensured only by repeating the conventional approaches of increasing the protection circuits as described above. Thus, further enhancement in protection of internal circuits from electrostatic breakdown would involve improvements in the characteristics of protection circuits as well as a quantitative improvement of the protection circuits; however, such improvements imply a technical problem as to how an inter-block protection circuit should be configured.

SUMMARY OF THE INVENTION

Accordingly, the present invention is directed to a semiconductor integrated circuit device that substantially obviates one or more of the problems due to limitations and disadvantages of the related art.

The present invention provides a semiconductor integrated circuit device that is resistant to electrostatic breakdown. The invention also improves the operational characteristics of protection circuits.

Additional features and advantages of the invention will be set forth in the description which follows, and in part, will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor integrated circuit device includes a plurality of internal circuits formed in a circuit forming region; a plurality of power lines separately connected to the internal circuits; a signal wire routed between the internal circuits; and a protection circuit connected to the power lines, the protection circuit including a parallel circuit having a first rectifying element formed in a p-type semiconductor region and a second rectifying element formed in an n-type semiconductor region.

In another aspect, the semiconductor integrated circuit device includes a plurality of internal circuits formed in a circuit formation region; a plurality of power lines separately connected to the internal circuits; a signal wire routed between the internal circuits; and a protection circuit connected to the power lines, the protection circuit including rectifying elements formed in portions of a p-type semiconductor region and an n-type semiconductor region, the p-type semiconductor region being adjacent to the n-type semiconductor region.

In a further aspect, the semiconductor integrated circuit device includes a plurality of internal circuits formed in a circuit formation region; a plurality of power lines separately connected to the internal circuits; a signal wire routed between the internal circuits; and a protection circuit connected to the power lines, the protection circuit including a parallel circuit having a first rectifying element formed in a p-type semiconductor region and a second rectifying element formed in a portion of an n-type semiconductor region adjacent to the p-type semiconductor region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Figure 1:
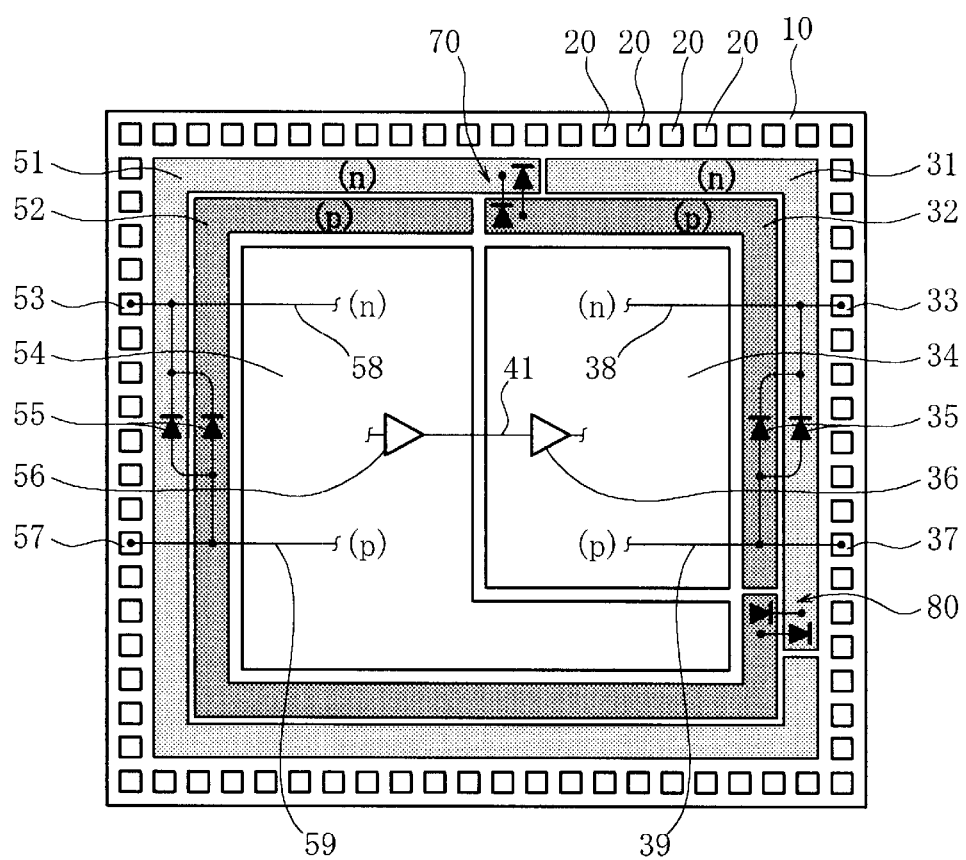
FIG. 1 is a plan view of a semiconductor integrated circuit device of a first embodiment of the present invention.
Figure 2:
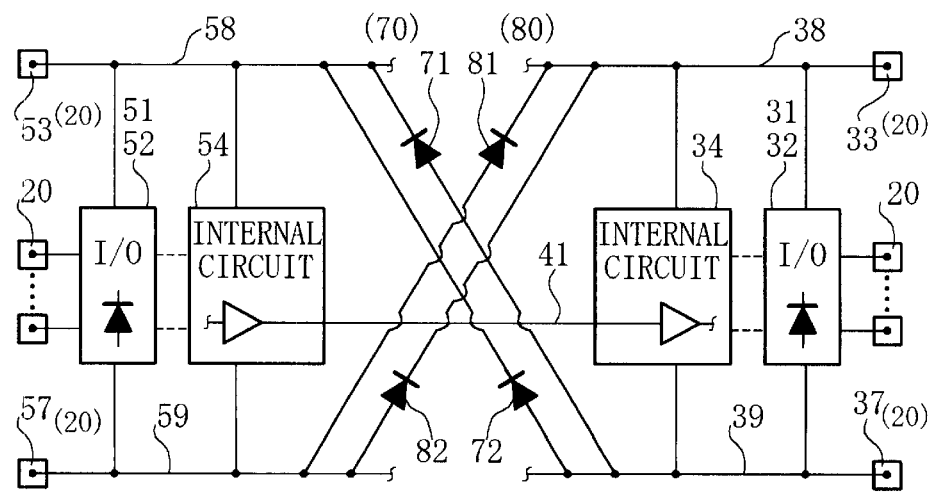
FIG. 2 is a circuit diagram for the semiconductor integrated circuit device illustrated in FIG. 1.
Figure 3:
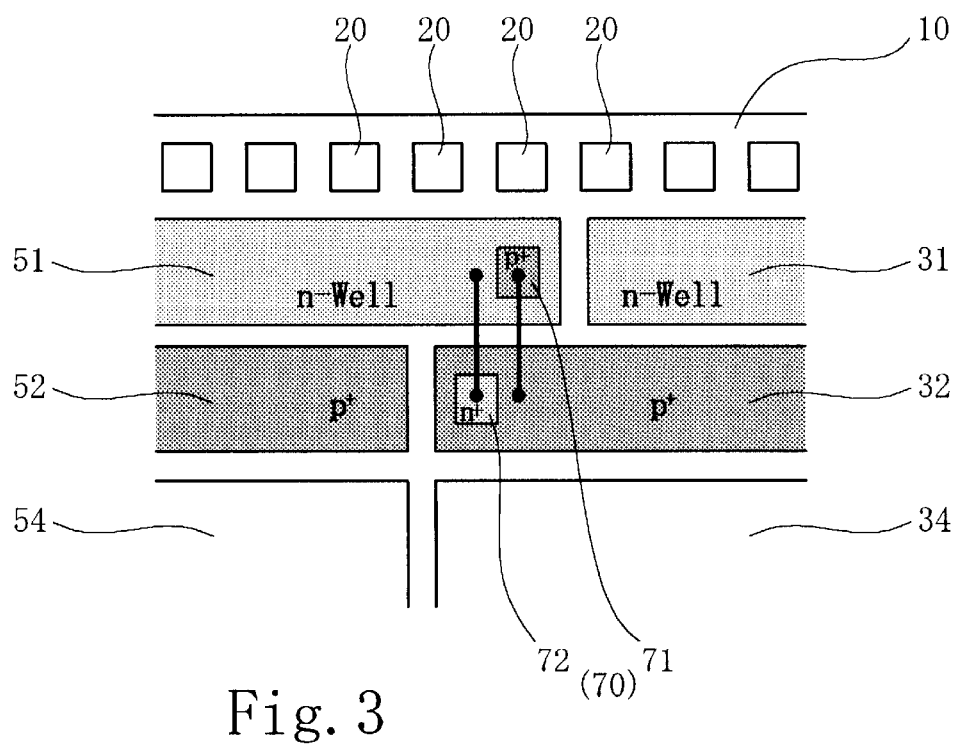
FIG. 3 is a partial plan view of a first portion of a protection circuit located along a top side of the semiconductor integrated circuit device.

Reference will now be made in detail to the preferred embodiments of the present invention, examples of which are illustrated in the accompanying drawings.

First Embodiment

A first embodiment of a semiconductor integrated circuit device 10 according to the present invention will be described in terms of its specific configuration with reference to FIGS. 1 to 6.

Many conventional, large scale integrated circuit devices are generally formed in one chip, and employ a substrate made of a p-type semiconductor, an n-type semiconductor, or an insulating material, with a surface allocated to a circuit formation region. In the circuit formation region, a plurality of external connection terminals 20, such as bonding pads, a plurality of first input/output circuits (not shown), and a plurality of internal circuits (not shown) are arranged in order from an outer periphery to a center. While the semiconductor integrated circuit device 10 is one of such large scaled integrated circuit devices, the semiconductor integrated circuit device 10 includes a first internal circuit 34 and a second internal circuit 54, the first internal circuit 34 and the second internal circuit 54 being driven by different supply voltages applied from separate power supplies (not shown), and as such are separately positioned in an upper right region and in a lower left region. In addition, the first input/output circuits are positioned near the first internal circuit 34, and several of a plurality of external connection terminals 20 along a right side of the semiconductor integrated circuit device 10 are connected to the first internal circuit 34 to relay signals associated with the first internal circuit 34 outside the semiconductor integrated circuit device 10 and to supply electric power to the first internal circuit 34. On the other hand, a plurality of second input/output circuits and several other of the external connection terminals 20 are connected to the second internal circuit 54 to relay signals associated with the second internal circuit 54 to the outside and to supply electric power to the second internal circuit 54.

A variety of combinations of supply voltages are contemplated for that supplied to the first internal circuit 34 and the second internal circuit 54, such as 12 volts and 5 volts, respectively; 5 volts and 3 volts, respectively; and 3 volts and 2 volts, respectively. In the drawings, circuits fed with a higher supply voltage (lower left ones in FIG. 1), and the plurality of elements contained therein, are designated by reference numerals beginning with "5," while circuits fed with a lower supply voltage (upper right ones in FIG. 1), and the plurality of elements contained therein, are designated by reference numerals beginning with "3." The same rule applies to FIGS. 3 to 7, which are described later.

With the configuration described above, reception of electric power from the outside for supply to the first internal circuit 34 requires at least a pair of power lines, for example, a first power supply line 38 for applying a relatively lower positive voltage such as three volts and a first grounding line 39, so that at least one of the external connection terminals 20 is assigned as a low power terminal 33 which is connected to the first power supply line 38, and at least one of the remaining external connection terminals 20 is assigned as a ground terminal 37 which is connected to the first grounding line 39. The first power supply line 38, and the first grounding line 39 individually extend as circular, tree-like, or stripe wires (not shown) and are routed through the first input/output circuits to the first internal circuit 34 in which the first power supply line 38, and the first grounding line 39 are also connected to a first input element 36 and a plurality of other multiple internal elements (not shown).

The first input/output circuits include a first n-type semiconductor region 31 which extends along an aligned portion of the external connection terminal 20, and a first p-type semiconductor region 32 extends parallel inside the first n-type semiconductor region 31. In the first p-type semiconductor region 32 and the first n-type semiconductor region 31, a plurality of intra-block protection circuits are provided. Although illustration is omitted, the intra-block protection circuits explicitly include a diode having an anode connected to a signal wire connected to one of the external connection terminals 20 for external signal input/output, and a cathode connected to the first power supply line 38; and a diode having a cathode connected to the signal wire and an anode connected to the first grounding line 39. Alternatively, as the illustrated intra-block protection circuit 35 provides the intra-block protection circuit 35 may include a diode having a cathode connected to the first power supply line 38 and an anode connected to the first grounding line 39. The intra-block protection circuit 35 may be produced associatively or parasitically by connecting the first power supply line 38 to the first n-type semiconductor region 31 within the input/output circuits and to the n-type semiconductor region within the internal circuit 34, and also by connecting the first grounding line 39 to the first p-type semiconductor region 32 within the input/output circuits and to the p-type semiconductor region within the internal circuit 34, or the intra-block protection circuit 35 may also be explicitly formed.

Also, although repetitive detailed description is omitted, similar wiring is also found in the internal circuit 54, in which a second power supply line 58 for applying a higher positive voltage, such as five volts is routed from a high power terminal 53 to the second internal circuit 54 through the second input/output circuits (not shown), while a grounding line 59, forming a pair with the second power supply line 58, is similarly routed from a grounding terminal 57 to the second internal circuit 54 through the second input/output circuits, and these power lines are connected to a second output element 56 and a plurality of other internal elements. Then, the first power supply line 38, the first grounding line 39, the second power supply line 58, and the second grounding line 59, or at least the first power supply line 38 and the second power supply line 58 will not be connected directly or short-circuited within the semiconductor integrated circuit device 10, even though they could be connected indirectly through a protection circuit, so that the first internal circuit 34 and the second internal circuit 54 act as a plurality of internal circuits associated with different power lines in a pair or a set.

Likewise, the second input/output circuits include a second n-type semiconductor circuit 51 along the external connection terminals 20 and a second p-type semiconductor region 52 immediately inside the second n-type semiconductor circuit 51, in a manner similar to the first input/output circuits. Also, the second input/output circuits are provided with intra-block protection circuits for respective signal wires, an intra-block protection circuit 55 connected to the second power supply line 58 and the second grounding line 59. Then, except for discontinuities due to partial separations, the first n-type semiconductor region 31 and the second n-type semiconductor region 51 form an outer quadrilateral, while the first p-type semiconductor region 32 and the second p-type semiconductor region 52 form an inner quadrilateral.

Further, for sending and receiving even between the second internal circuit 54 and the first internal circuit 34, for example, the second output element 56 of the second internal circuit 54 and the first input element 36 of the first internal circuit 34 are connected through an inter-circuit signal wire 41. The signal wire 41 may be directed in opposite directions or may be bidirectional, and a number of wires required for sending and receiving signals are provided between the first internal circuit 34 and the second internal circuit 54.

Additionally, the semiconductor integrated circuit device 10 is provided with a second inter-block protection circuit 70 and a first inter-block protection circuit 80 introduced as protection circuits which are electrically connected to the power line pairs of the first power supply line 38 and the first grounding line 39; and the second power supply line 58 and the second grounding line 59. In addition, certain features are included in the layout in locations at which the second inter-block protection circuit 70 and the first inter-block protection circuit 80 are arranged.

Explaining in greater detail, the second inter-block protection circuit 70 (see FIGS. 1, 2) is mainly composed of a pair or a set of protection diodes, a second outer diode 71 and a first inner diode 72, both the second outer diode 71 and the first inner diode 72 being rectifying elements, which are positioned near a boundary along which the input/output circuits are divided into upper right and lower left blocks along a top side of the semiconductor integrated circuit device 10. In this region (see FIG. 3), the second n-type semiconductor region 51 of the second input/output circuits is extended to the right into the first input/output circuits beyond the boundary, while the first n-type semiconductor region 31 of the first input/output circuits is correspondingly reduced to retract from the boundary. The first p-type semiconductor region 32 and the second p-type semiconductor region 52 remain unchanged, and are aligned along a boundary of the first internal circuit 34 and the second internal circuit 54. Within such a surrounding zone, the first n-type semiconductor region 31, the first p-type semiconductor region 32, the second n-type semiconductor region 51, and the second p-type semiconductor region 52 corresponding to each of the first internal circuit 34 and the second internal circuit 54, respectively, are formed such that a boundary between the first p-type semiconductor region 32 and the second p-type semiconductor region 52 is offset from a boundary between the first n-type semiconductor region 31 and the second n-type semiconductor region 51 in the circumferential direction, thereby causing the second n-type semiconductor region 51 and the first p-type semiconductor region 32 to partially run in parallel, substantially adjacent to each other.

The second outer diode 71 (see FIG. 3) in the second inter-block protection circuit 70 is formed in the aforementioned extension of the second n-type semiconductor region 51 with its anode connected to the first p-type semiconductor region 32 through a metal wire or the like. The wiring is made at a minimum distance across adjacent portions of both the second n-type semiconductor region 51 and the first p-type semiconductor region 32. The first inner diode 72 in turn is formed near the left end of the first p-type semiconductor region 32, with its cathode connected to the second n-type semiconductor region 51 through a metal wire or the like. The wiring is similarly made at a minimum distance across the adjacent portions of both the first p-type semiconductor region 32 and the second n-type semiconductor region 51. With the arrangement described above, both wires run substantially parallel to each other, without intersection, even though their lengths are minimal. In addition, the second outer diode 71 and the first inner diode 72 associated therewith have breakdown voltages higher than proper supply voltages supplied to the first internal circuit 34 and the second internal circuit 54 and lower than the breakdown of the internal elements in the first internal circuit 34 and the second internal circuit 54 by virtue of appropriate designs involving impurity concentrations, thicknesses, and so on.

Figure 4:
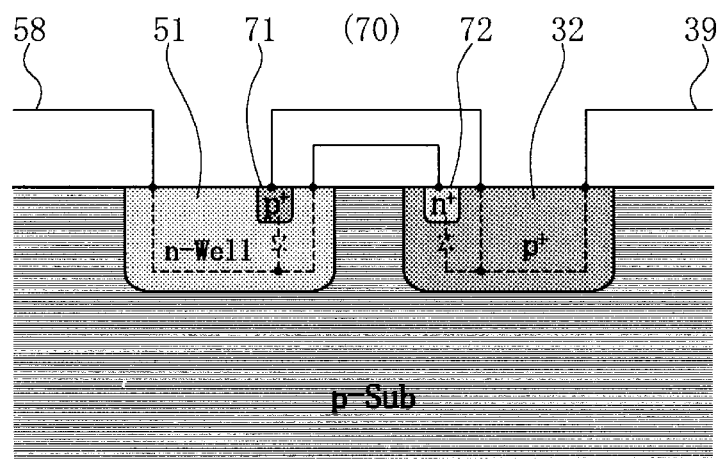
FIG. 4 is a schematic vertical section view of the first portion of the protection circuit illustrated in FIG. 3.
Figure 5:
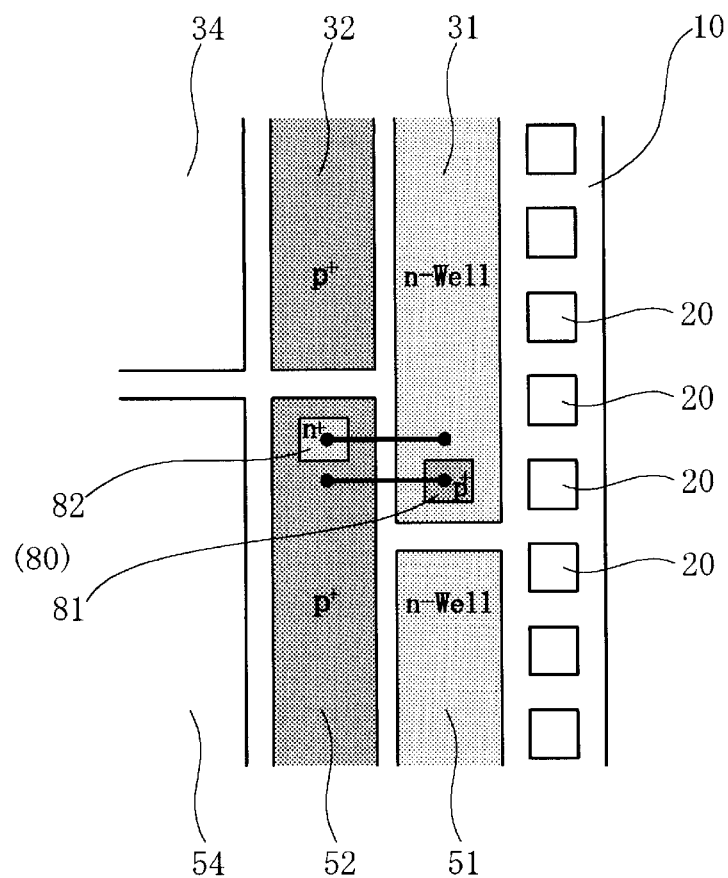
FIG. 5 is a partial plan view of a second portion of the protection circuit located along a lateral side of the semiconductor integrated circuit device.
Figure 6:
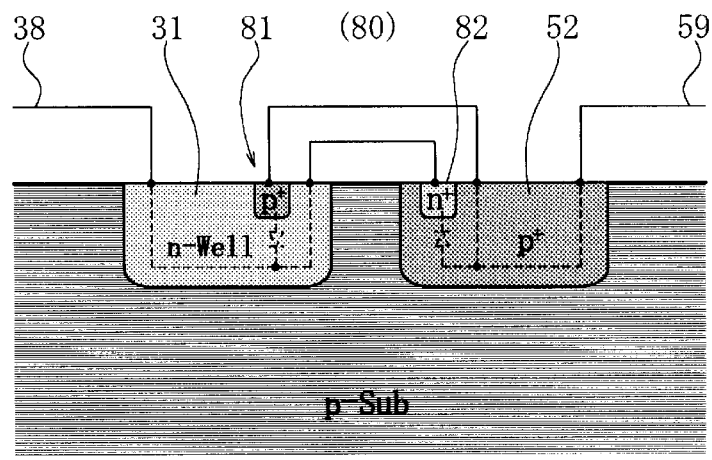
FIG. 6 is a schematic vertical section view of the second portion of the protection circuit illustrated in FIG. 5.

Referring now to FIG. 4, it should be noted that while the second n-type semiconductor region 51 corresponding to the cathode of the second outer diode 71 is generally clamped to the second power supply line 58, the wiring therefor is also performed explicitly if necessary. Similarly, the first p-type semiconductor region 32 corresponding to the anode of the first inner diode 72 is clamped to the first grounding line 39.

The completed second inter-block protection circuit 70 is formed in adjacent portions or neighboring portions of the first p-type semiconductor region 32 and the second n-type semiconductor region 51 in the input/output circuits of different blocks, including a parallel circuit comprising the first inner diode 72 formed in the first p-type semiconductor region 32 and the second outer diode 71 formed in the second n-type semiconductor region 51.

Generally in a similar manner, the first inter-block protection circuit 80 (see FIGS. 1, 2) is mainly composed of a pair or a set of protection diodes of a first outer diode 81 and a second inner diode 82, the first outer diode 81 and the second inner diode 82 being rectifying elements, which are positioned near a boundary of the first input/output circuits and is divided into upper fight and lower left blocks along a right side of the semiconductor integrated circuit device 10. In this region (see FIGS. 5, 6), the first n-type semiconductor region 31 is extended downwardly, while the second n-type semiconductor region 51 is correspondingly reduced. Then, within the surrounding zones of the first input/output circuits, inner side regions of the first p-type semiconductor region 32 and the second p-type semiconductor region 52 and the first n-type semiconductor region 31 and the second n-type semiconductor region 51 are offset from each other in a circumferential direction to cause the first n-type semiconductor region 31 to be positioned substantially adjacent to the second p-type semiconductor region 52. In these adjacent regions, the first outer diode 81 is formed in an extension of the first n-type semiconductor region 31, while the second inner diode 82 is formed near an end of the second p-type semiconductor region 52. Then, the first outer diode 81 and the second inner diode 82 are both connected through wires at a minimum distance across adjacent portions of the regions first n-type semiconductor region 31 and the second p-type semiconductor region 52. Further, with existing or additional clamp connections, connections with the first power supply line 38 and the second grounding line 59 are established. Likewise, the first inter-block protection circuit 80 is also formed in adjacent portions of the second p-type semiconductor region 52 and the first n-type semiconductor region 31 in the input/output circuits of different blocks, including the a parallel circuit comprised of the second inner diode 82 formed in the second p-type semiconductor region 52 and the first outer diode 81 formed in the first n-type semiconductor region 31. In addition, the first outer diode 81 and the second inner diode 82 also have breakdown voltages higher than the proper supply voltages and lower than the breakdown of the internal elements.

Next, the semiconductor integrated circuit device 10 according to the first embodiment will be described for its usage and operation. Generally, the usage of the semiconductor integrated circuit device 10, as well as normal operations of the first internal circuit 34 and the second internal circuit 54 and the first and second input/output circuits are similar to ordinary usage of semiconductor integrated circuits and operations of corresponding conventional circuits. Also, the semiconductor integrated circuit device 10 is specifically designed in accordance with each application purpose, so that such general description is omitted. The following discussion will be focused on the operation of the second inter-block protection circuit 70 and the first inter-block protection circuit 80 when surge noise is produced, in line with the purpose of the present invention.

As surge noise is introduced from any of the external connection terminals 20, the first intra-block protection circuit 35 acts to prevent the potential difference from increasing between the power line pair of the first power supply line 38 and the first grounding line 39, while the second intra-block protection circuit 55 acts to prevent the potential difference from increasing between the power line pair of the second power supply line 58 and the second grounding line 59. However, since such actions are not effective to the potential difference between the power line pair of the first power supply line 38 and the first grounding line 39 and the power line pair of the second power supply line 58 and the second grounding line 59, the potential difference between both the line pairs are likely to increase. As this potential difference increases an inversion of the potentials on the first grounding line 39 and the second power supply line 58 may result, or inversion of the potentials on the first power supply line 38 and the second grounding line 59, or result in an extremely large potential difference, if not inversion.

Thus, if potential on the first grounding line 39 exceeds potential on the second power supply line 58 to present an abnormal event, both the second outer diode 71 and the first inner diode 72 immediately become conductive to let surge noise, even having a large amount of charge, promptly escape from the first grounding line 39 to second power supply line 58. In this way, the surge noise, which may invert the potentials on the first grounding line 39 and the second power supply line 58, is dispersed promptly and reliably by the second inter-block protection circuit 70. On the other hand, if the potential on the second grounding line 59 exceeds the potential on the first power supply line 38 to present an abnormal event, both the first outer diode 81 and the second inner diode 82 immediately become conductive to let surge noise, even having a large amount of charge, promptly escape from the second grounding line 59 to the first power supply line 38. In this way, the surge noise, which may invert the potentials on the second grounding line 59 and the first power supply line 38, is dispersed promptly and reliably by the first inter-block protection circuit 80.

Further, as the potential on the second power supply line 58 rises much higher than the potential on the first grounding line 39, the first inner diode 72 in the first p-type semiconductor region 32 is broken down to become conductive, thereby causing surge noise to promptly escape from the second power supply line 58 to the first grounding line 39. If the abnormal state in potential difference is not yet solved, the second outer diode 71 in the first n-type semiconductor region 31 is also broken down to become conductive, thereby causing surge noise, even having a large amount of charge, to reliably escape. In this way, the second inter-block protection circuit 70 promptly and reliably disperses surge noise which would abnormally increase the potential difference between the second power supply line 58 and the first grounding line 39. Also, if the potential on the first power supply line 38 rises much higher than the potential on the power line 59, the second inner diode 82 in the p-type semiconductor region 52 immediately becomes conductive, causing surge noise to promptly escape from the first power supply line 38 to the second grounding line 59. If the abnormal state in potential difference is not yet solved, the first outer diode 81 in the first n-type semiconductor region 31 also becomes conductive, thereby causing the surge noise, even having a large amount of charge, to reliably escape. In this way, the first inter-block protection circuit 80 promptly and reliably disperses surge noise which would abnormally increase the potential difference between the first power supply line 38 and the second grounding line 59.

Thus, since surge noise in either of directions is dispersed without fail between the power line pair of the first power supply line 38 and the first grounding line 39 and the power line pair of the second power supply line 58 and the second grounding line 59 in the different systems, an increase in potential difference between both blocks is limited or reduced to suppress the potential difference produced between both ends of the inter-circuit signal wire 41, and an abnormal voltage which would be applied to an output terminal of the output element 56 and an input terminal of the input element 36, to which the inter-circuit signal wire 41 is connected, consequently protecting the input element 36 and the output element 56 more reliably from electrostatic breakdown.

Second Embodiment

Figure 7:
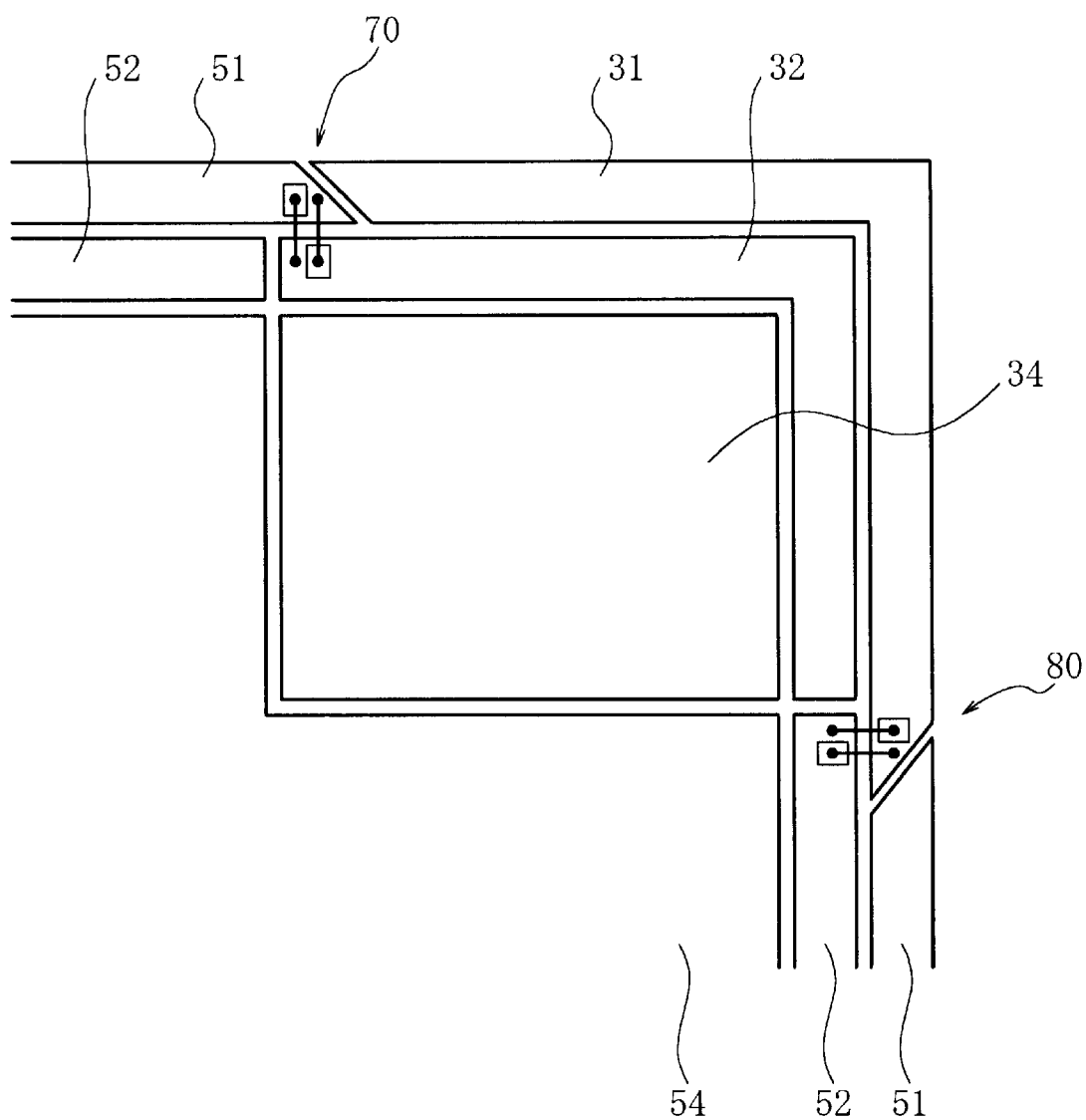
FIG. 7 is a plan view of a zone comprising a plurality of protection circuits of a second embodiment of the present invention.

A second embodiment of a semiconductor integrated circuit device 10 according to the present invention will be described in terms of its specific configuration with reference to FIG. 7. FIG. 7 is a top plan view illustrating the layout of a region which includes a second protection circuit 70 and a first protection circuit 80.

The semiconductor integrated circuit device 10 of the second embodiment differs from the semiconductor integrated circuit device 10 of FIG. 1 in that opposing edges of a first n-type semiconductor region 31 and a second n-type semiconductor region 51 are not simply retracted perpendicularly to the associated sides of the chip to form steps as illustrated in FIG. 1, but the first n-type semiconductor region 31 and the second n-type semiconductor region 51 are retracted, to a larger degree on the inner side, near a first p-type semiconductor region 32 and a second p-type semiconductor region 52, and with a smaller degree on the outer side, so that a boundary between the first n-type semiconductor region 31 and the second n-type semiconductor region 51 is defined in an oblique direction.

With the configuration described above, it is possible to sufficiently ensure a length over which the second n-type semiconductor region 51 is placed adjacent to the first p-type semiconductor region 32, and the length over which the first n-type semiconductor region 31 is placed adjacent to the second p-type semiconductor region 52, while minimizing the amount of offset (area) of an outer side defined by the first n-type semiconductor region 31 and the second n-type semiconductor region 51 of the first input/output circuits to the first internal circuit 34 and the second internal circuit 54 and an inner side of the first p-type semiconductor region 32 and the second p-type semiconductor region 52 of the second input/output circuits.

Other Embodiments

In the respective embodiments described above, the present invention can be applied even when the internal circuits are comprised of such elements as FETs of CMOS-, pMOS-, NMOS-, MNOS-type, or any other type. In addition, the internal circuits may include bipolar transistors, and may be digital circuits or analog circuits.

The number of internal circuits is not limited to two, but may be three or more. The internal circuits are not limited in location or shape, so that they may be arranged on any of left, right, top, and bottom sides of the chip, and in any arbitrary shape, without being limited to the aforementioned quadrilateral.

While the foregoing embodiments show the input/output circuits which have an outer n-type semiconductor region and an inner p-type semiconductor region, the present invention is not limited to this particular configuration. Alternatively, the input/output circuits may have an outer p-type semiconductor region and an inner n-type semiconductor region. Also, the input/output circuits are not limited in number of regions, and may be formed in annular shape including three or more loops, not limited to the double annular shape.

The power lines are not either limited to a pair of power lines, one for applying a positive voltage and one for grounding. Alternatively, a variety of combinations are contemplated for the power lines, for example, a pair of positive and negative voltages; a set of positive and negative voltages and the ground; a set of a higher voltage, a lower voltage and another reference voltage, and so on.

While specific examples of external connection terminals are represented by bonding pads, those referred to as bumps, balls, lands, electrodes, and so on may be used in accordance with a variety of configuration of particular integrated circuits.

Further, while the foregoing embodiments have shown a p-type substrate, the substrate is not limited to the p-type one, but may be an n-type or an insulating substrate. Furthermore, the substrate is not limited to that made of silicon, but may be made of gallium arsenide (GaAs) or the like.

Also, since the present invention neither excludes a conventional intra-block protection circuit or an inter-block protection circuit, nor assumes these circuits, the present invention may be applied after such protection circuits are removed, or the present invention may be applied in combination with such protection circuits.

In essence, as is apparent from the foregoing description, when a protection circuit is provided between power lines in the semiconductor integrated circuit device of the present invention, the protection circuit is distributively formed over p-type and n-type regions, i.e., different types of regions, so that internal circuits can be appropriately protected from a variety of surge noise by cooperative actions of elements which exhibit different characteristics. In addition, since the protection circuit is not formed locally in a particular portion of the device, and can save the area dedicated thereto, the layout can be readily designed for the overall semiconductor integrated circuit device. Consequently, it is possible to facilitate the implementation of a semiconductor integrated circuit device which is resistant to electrostatic breakdown.

Also, the inter-block protection circuit formed near the boundary of p-type and n-type regions results in requirements of shorter wires which allow surge noise to promptly escape, and in less burden on the design such as the routing of wires. Consequently, it is possible to facilitate in the implementation of a semiconductor integrated circuit device which is resistant to electrostatic breakdown.

Further, since the surrounding zones for input/output circuits are unitized to form the inter-block protection circuit, it is possible to even more readily implement a semiconductor integrated circuit device which is resistant to electrostatic breakdown.

What is claimed is:

1. A semiconductor integrated circuit device that provides intra-circuit and inter-circuit protection from electrostatic breakdown comprising:
   a plurality of internal circuits formed in a circuit formation region;
   a plurality of power lines separately connected to the internal circuits;
   a signal wire routed between the internal circuits;
   a protection circuit connected to the power lines, the protection circuit including a parallel circuit having a first rectifying element formed in a p-type semiconductor region and a second rectifying element formed in an n-type semiconductor region.

2. The semiconductor integrated circuit device according to claim 1, further comprising a substrate formed in a chip, wherein the circuit formation region is formed on an upper surface of the substrate.

3. The semiconductor integrated circuit device according to claim 2, wherein the circuit formation region includes a surrounding zone having an input circuit, an output circuit, and the protection circuit, the surrounding zone surrounds the internal circuits.

4. The semiconductor integrated circuit device according to claim 3, wherein the surrounding zone includes an inner region and an outer region, the inner and outer regions being divided into the p-type and n-type semiconductor regions, and a first boundary of the p-type and n-type semiconductor regions in the inner region offset from a secondary boundary of the p-type and n-type semiconductor regions in the outer region in a circumferential direction proximate the protection circuit.

5. The semiconductor integrated circuit device according to claim 4, further comprising a plurality of external connection terminals outside the surrounding zone in the circuit formation region.

6. A semiconductor integrated circuit device that provides intra-circuit and inter-circuit protection from electrostatic breakdown comprising:
   a plurality of internal circuits formed in a circuit formation region;
   a plurality of power lines separately connected to the internal circuits;
   a signal wire routed between the internal circuits; and
   a protection circuit connected to the power lines, the protection circuit including a plurality of rectifying elements formed in portions of a p-type semiconductor region and an n-type semiconductor region, the p-type semiconductor region being adjacent to the n-type semiconductor region.

7. The semiconductor integrated circuit device according to claim 6, further comprising a substrate formed in a chip, wherein the circuit formation region is formed on an upper surface of the substrate.

8. The semiconductor integrated circuit device according to claim 7, wherein the circuit formation region includes a surrounding zone having an input circuit, an output circuit, and the protection circuit, the surrounding zone surrounds the internal circuits.

9. The semiconductor integrated circuit device according to claim 8, wherein the surrounding zone includes an inner region and an outer region, the inner and outer regions being divided into the p-type and n-type semiconductor regions, and a first boundary of the p-type and n-type semiconductor regions in the inner region offset from a second boundary of the p-type and n-type semiconductor regions in the outer region in a circumferential direction proximate the protection circuit.

10. The semiconductor integrated circuit device according to claim 9, further comprising a plurality of external connection terminals outside the surrounding zone in the circuit formation region.

11. A semiconductor integrated circuit device that provides intra-circuit and inter-circuit protection from electrostatic breakdown comprising:
a plurality of internal circuits formed in a circuit formation region;
a plurality of power lines separately connected to the internal circuits;
a signal wire routed between the internal circuits; and
a protection circuit connected to the power lines, the protection circuit including a parallel circuit having a first rectifying element formed in a p-type semiconductor region and a second rectifying element formed in a portion of an n-type semiconductor region adjacent to the p-type semiconductor region.

12. The semiconductor integrated circuit device according to claim 11, further comprising a substrate formed in a chip, wherein the circuit formation region is formed on an upper surface of the substrate.

13. The semiconductor integrated circuit device according to claim 12, wherein the circuit formation region includes a surrounding zone having an input circuit, an output circuit, and the protection circuit, the surrounding zone surrounds the internal circuits.

14. The semiconductor integrated circuit device according to claim 13, wherein the surrounding zone includes an inner region and an outer region, the inner and outer regions being divided into the p-type and n-type semiconductor regions, and a first boundary of the p-type and n-type semiconductor regions in the inner region offset from a second boundary of the p-type and n-type semiconductor regions in the outer region in a circumferential direction proximate the protection circuit.

15. The semiconductor integrated circuit device according to claim 14, further comprising a plurality of external connection terminals outside the surrounding zone in the circuit formation region.

* * * * *